United States Patent
Badel et al.

(10) Patent No.: US 11,121,648 B2
(45) Date of Patent: Sep. 14, 2021

(54) PIEZOELECTRIC GENERATOR

(71) Applicants: Commissariat à l'Energie Atomique et aux Energies Alternatives, Paris (FR); UNIVERSITE SAVOIE MONT BLANC, Chambery (FR)

(72) Inventors: Adrien Badel, Lescheraines (FR); Pierre Gasnier, Grenoble (FR); Romain Grezaud, Grenoble (FR); Adrien Morel, Grenoble (FR); Gaël Pillonnet, Proveysieux (FR)

(73) Assignees: COMMISSARIAT À L'ENERGIE ATOMIQUE ET AUX ENERGIES ALTERNATIVES, Paris (FR); UNIVERSITE SAVOIE MONT BLANC, Chambery (FR)

( * ) Notice: Subject to any disclaimer, the term of this patent is extended or adjusted under 35 U.S.C. 154(b) by 674 days.

(21) Appl. No.: 16/038,157

(22) Filed: Jul. 17, 2018

(65) Prior Publication Data
US 2019/0028041 A1 Jan. 24, 2019

(51) Int. Cl.
| | |
|---|---|
| *H02N 2/18* | (2006.01) |
| *H01L 41/113* | (2006.01) |
| *H01L 41/04* | (2006.01) |
| *H01L 41/08* | (2006.01) |
| *H02M 7/219* | (2006.01) |
| *H02M 1/00* | (2006.01) |

(52) U.S. Cl.
CPC ........... *H02N 2/181* (2013.01); *H01L 41/042* (2013.01); *H01L 41/08* (2013.01); *H01L 41/113* (2013.01); *H02M 7/219* (2013.01); *H02N 2/188* (2013.01); *H02M 1/0006* (2021.05); *H02M 7/2195* (2021.05)

(58) Field of Classification Search
CPC .......... H02N 2/18; H02N 2/181; H02N 2/188; H01L 41/113; H01L 41/042; H01L 41/08; H02M 7/219; H02M 7/2195; H02M 1/0006

See application file for complete search history.

(56) References Cited

U.S. PATENT DOCUMENTS

| | | | |
|---|---|---|---|
| 9,112,433 B2 * | 8/2015 | Ide | H02N 2/181 |
| 2011/0227543 A1 | 9/2011 | Ivanov | |
| 2012/0119618 A1 * | 5/2012 | Tabata | H02N 2/181 |
| | | | 310/319 |
| 2012/0153773 A1 * | 6/2012 | Lee | H02N 2/188 |
| | | | 310/319 |
| 2013/0082570 A1 * | 4/2013 | Ide | H02N 2/181 |
| | | | 310/319 |
| 2014/0084876 A1 * | 3/2014 | Ramorini | H02N 2/181 |
| | | | 320/166 |
| 2014/0104002 A1 | 4/2014 | Bottarel et al. | |

(Continued)

FOREIGN PATENT DOCUMENTS

WO 2012101037 A1 8/2012

OTHER PUBLICATIONS

Preliminary Search Report in French Patent Application No. 1756814 dated Mar. 20, 2018, 2 pages.

*Primary Examiner* — J. San Martin
(74) *Attorney, Agent, or Firm* — Moreno IP Law LLC

(57) ABSTRACT

A piezoelectric generator including: a piezoelectric element; a circuit for shorting and placing in open circuit the piezoelectric element; and an inductive converter.

16 Claims, 4 Drawing Sheets

(56) References Cited

U.S. PATENT DOCUMENTS

2014/0218989 A1* 8/2014 Mateu S Ez ........... G01R 19/04
  363/126
2015/0311824 A1  10/2015 Eltamaly et al.

* cited by examiner

PIEZOELECTRIC GENERATOR

CROSS-REFERENCE TO RELATED APPLICATION

This application claims the priority benefit of French patent application number 17/56814, the content of which is hereby incorporated by reference in its entirety to the maximum extent allowable by law.

FIELD

The present disclosure generally concerns energy recovery systems, and more particularly concerns vibratory energy recovery systems. The present disclosure more particularly concerns a piezoelectric generator.

BACKGROUND

Energy converters supplying an AC or DC voltage are widely used in electronic systems, be they based on an electro-magnetic element, a piezoelectric element, or other. Piezoelectric generators are particularly adapted to microelectronics, particularly for systems having a low power consumption or which are desired to be autonomous.

However, most current piezoelectric generators only properly operate at the resonance frequency of the piezoelectric system, which is intrinsic to this element (due, among others, to the nature of the material and to the shape and to the dimensions of the resonator). Most often, so-called continuous extraction techniques, based on a resistive impedance matching via a DC/DC converter and discontinuous extraction techniques, based on a charge of the capacitor of the piezoelectric element in open circuit and a discharge of this capacitor to supply the energy when the voltage across the piezoelectric element is maximum, can be found.

More recently, it has been provided to recover the energy over a frequency band. Such systems use a reactive load to adapt the resonance frequency.

For example, document WO A 20120101037 describes a piezoelectric generator which uses the inductive behavior of the piezoelectric element over a given frequency band by adapting the impedance due to a switched capacitor array. The frequency range is however limited to a few Hertz due to the limited coupling of the piezoelectric element (with the capacitor array). Further, the pitch of the setting is conditioned by the number of capacitors, which rapidly adversely affects the size of the system.

According to another example, an inductance switchable in parallel on the piezoelectric element is used and the energy is sampled across the inductance. The phase and the amplitude of the voltage across the piezoelectric element are thus controlled and an inductive or capacitive impedance is thus emulated. However, the more the operating frequency is distant from the resonance frequency of the piezoelectric element, the higher the losses in the inductance and the more they deteriorate the efficiency. In practice, such a technique thus only properly operates at the resonance frequency of the piezoelectric element.

It has already been provided to emulate an impedance from a piezoelectric element by using a pulse-width modulation (PWM) of the voltage across the piezoelectric element. The principle is to chop the voltage across the piezoelectric element and to modulate the duty cycle to control the phase of the voltage. Such a technique however requires significant energy to control transistors performing the PWM and the final efficiency of the energy recovery is thus low.

SUMMARY

There is a need for a piezoelectric vibration energy recovery device which can operate over a wide frequency band. In particular, in most applications where a source of vibrations which can be used for an energy conversion is available, the frequency is not constant but varies over a range of a few Hertz, around the resonance frequency of the piezoelectric element. It is thus important to be able to use a wideband piezoelectric generator.

An embodiment overcomes all or part of the disadvantages of current piezoelectric generators.

An embodiment provides a wideband solution, that is, operating over a vibration frequency range of several tens of Hertz.

Thus, an embodiment provides a piezoelectric generator comprising:
   a piezoelectric element;
   a switching circuit coupled to the piezoelectric element;
   an inductive converter; and
   a circuit for controlling the switching circuit to, sequentially:
      short the piezoelectric element;
      open the piezoelectric circuit; and
      connect the piezoelectric element to the inductive converter.

According to an embodiment:
   the switching from the shorting to the placing in open circuit of the piezoelectric element depends on information representative of the deformation of the piezoelectric element; and
   the switching from the open circuit to the connection of the piezoelectric element to the inductive converter depends on the voltage across the piezoelectric element.

According to an embodiment, the conditions of the switching from the shorting to the placing in open circuit of the piezoelectric element and of the switching from the open circuit to the connection of the piezoelectric element to the inductive converter are defined by a regulator of the maximum power point to maximize the energy transferred to a load powered by the inductive converter.

According to an embodiment, the generator comprises at least one switch controlled by the control circuit to perform the shorting or the opening.

According to an embodiment, the switching from the state where the piezoelectric element is connected to the inductive converter to the state where the piezoelectric element is shorted is performed when the voltage across the piezoelectric element is zero.

According to an embodiment, the piezoelectric element is sequentially:
   shorted;
   placed in open circuit; and
   connected to the inductive converter.

According to an embodiment, said switching circuit is controlled to optimize the energy transfer to a load powered by the inductive converter.

According to an embodiment, said switching circuit includes a voltage rectifier.

According to an embodiment, said switching circuit comprises a rectifying bridge having input terminals coupled to terminals of the piezoelectric element and having output terminals coupled to the input of the inductive converter.

According to an embodiment, said circuit comprises two series-connected switches, connected across the piezoelectric element, the junction point of the switches being connected to one of the output terminals of the rectifying bridge.

According to an embodiment, the inductive converter comprises a transformer having a first winding series-connected with a third switch between said output terminals of the bridge.

An embodiment provides a generator where said inductive converter comprises an inductive element series-connected with a third switch between the output terminals of the rectifying bridge.

According to an embodiment, said circuit comprises a switch connected between said output terminals of the bridge.

According to an embodiment, said inductive converter comprises an inductive element series-connected with a third switch between input terminals of a rectifying bridge having output terminals connected to output terminals of the generator.

According to an embodiment, the piezoelectric element is coupled to or is assembled on a mechanical object capable of making it vibrate.

An embodiment provides a method of controlling a piezoelectric generator having a piezoelectric element capable of being excited by a mechanical object, comprising successive phases of:

shorting the piezoelectric element;

placing the piezoelectric element in open circuit; and transferring the charges stored during the open circuit phase to an inductive converter.

According to an embodiment, the duration of the open circuit phase is a function, among others, of the damping and of the coupling of the type of piezoelectric generator used, to optimize the power transfer to a load.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
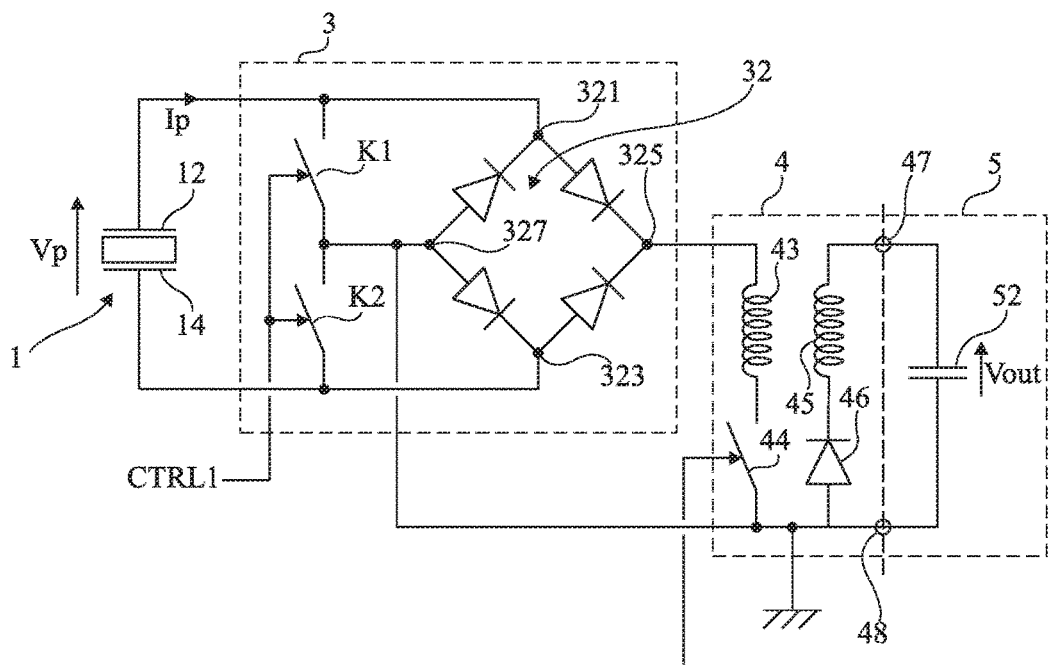
FIG. 1 is a simplified representation of an embodiment of a piezoelectric generator.

For clarity, only those elements which are useful to the understanding of the described embodiments have been shown and will be detailed. In particular, the structure and the forming of the circuits downstream of the piezoelectric generator have not been detailed, the described embodiments being compatible with usual vibration energy recovery applications, for example, motors, fuselages, shoe soles, pacemakers, switches, etc.

It should be noted that, in the drawings, the structural and/or functional elements common to the different embodiments may be designated with the same reference numerals and may have identical structural, dimensional, and material properties. The terms "approximately", "substantially", and "in the order of" are used herein to designate a tolerance of plus or minus 10%, preferably of plus or minus 5%, of the value in question, or of plus or minus 10°, preferably of plus or minus 5°.

Unless otherwise specified, when reference is made to two elements connected together, this means directly connected with no intermediate element other than conductors, and when reference is made to two elements coupled together, this means that the two elements may be directly coupled (connected) or be coupled via one or a plurality of other elements.

FIG. 1 is a simplified representation of an embodiment of a piezoelectric generator.

Such a generator comprises a piezoelectric element 1, made of a piezoelectric material supported by, or coupled to, a mechanical object (resonator) capable of transforming vibrations of a structure into deformations applied to the piezoelectric material. The two electrodes 12 and 14 of piezoelectric element 1 are coupled by a switching circuit 3 formed of switches, among which at least one controllable switch.

The function of circuit 3 is to allow a shorting and a placing in open circuit of electrodes 12 and 14 of element 1, as well as to rectify the signal sampled between the electrodes. In the example of FIG. 1, it is assumed that circuit 3 comprises two series-connected switches K1 and K2 controlled by a signal CTRL 1 and, coupling electrodes 12 and 14 to each other, and a fullwave rectifying bridge 32. Two input terminals 321 and 323 of bridge 32 are respectively connected to terminals 12 and 14. Two rectified output terminals 325 and 327 are coupled to the respective inputs of an inductive converter 4, terminal 327 being further coupled to the junction point 34 of switches K1 and K2 and representing the ground.

Inductive converter 4 has the function of transferring the electric energy generated by piezoelectric element 1 to a load 5 (energy storage element such as a capacitor 52 or, directly, electronic application circuits). Converter 4 may be an inductive element, a transformer, a DC-DC converter, etc. In the example of FIG. 1, converter 4 is a transformer having a primary winding 43 series-connected with a switch 44, controlled by a signal CTRL2, between terminals 325 and 327. A secondary winding 45 of the transformer is series-connected with a diode 46 between output terminals 47 and 48 of converter 4, coupled in this example to the electrodes of storage capacitor 52. Diode 46 prevents the discharge of capacitor 52 into inductance 45. Terminal 48 is coupled to ground.

Signals CTRL1 and CTRL2 are generated by a circuit (not shown) according to the vibrations of piezoelectric element 1 to respect a power transfer at the resonance of element 1. The operation is based on a setting of the times in open circuit and in short-circuit of piezoelectric element 1 by providing a discharge of the element at the end of the open circuit periods into the inductive circuit (resonance) to recover the energy stored in the piezoelectric element. The successive switching phases are short-circuit, open circuit, resonance, short-circuit, open circuit, resonance, short-circuit, etc. The cumulated duration of the three phases, short-circuit, open circuit, and resonance, approximately corresponds to a half-period of oscillation of the piezoelectric element.

FIGS. 2A, 2B, 2C, and 2D illustrate, in timing diagrams, the operation of the generator of FIG. 1.

Figure 2A:
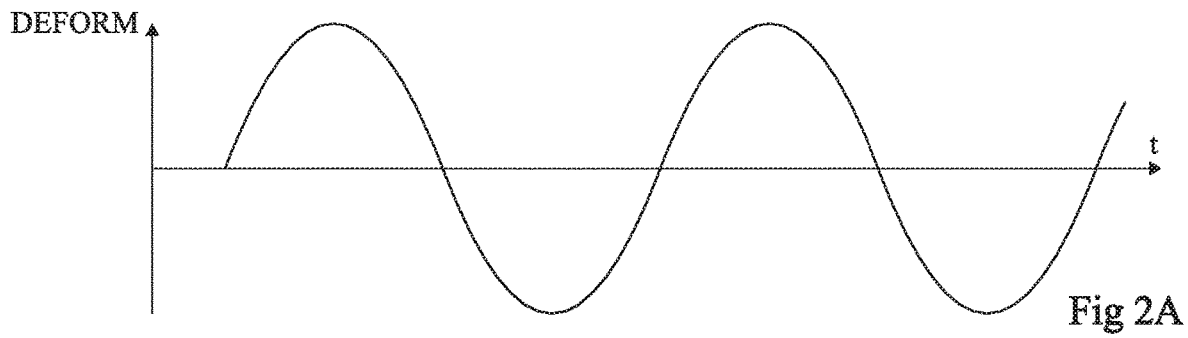
FIGS. 2A, 2B, 2C, and 2D illustrate, in timing diagrams, the operation of the generator of FIG. 1.
Figure 2B:
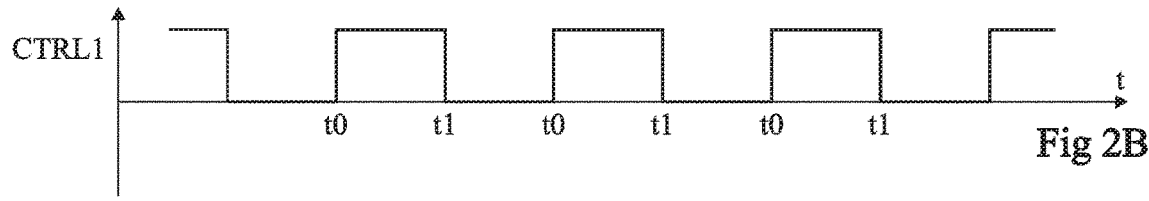
Figure 2C:
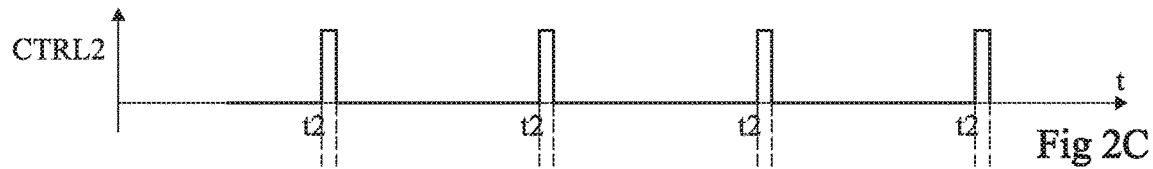
Figure 2D:
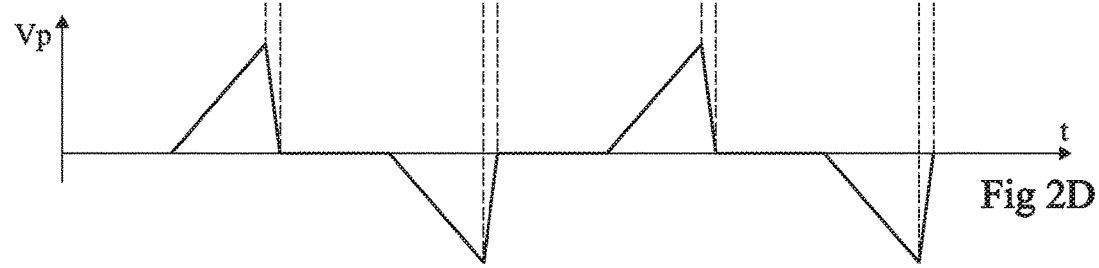

FIG. 2A illustrates an example of shape of the deformation DEFORM applied to the piezoelectric material submitted to mechanical vibrations. FIG. 2B illustrates the shape of control signal CTRL1. FIG. 2C illustrates the shape of control signal CTRL2. FIG. 2D illustrates the shape of voltage Vp across piezoelectric element 1.

Piezoelectric element 1 is shorted during the time periods (between times t0 and t1) when signal CTRL1 is active (switches K1 and K2 on). During these time periods, voltage Vp across piezoelectric element 1 is zero and the charges associated with the vibrations are transferred from one electrode to the other of element 1. At times t1, switches K1 and K2 are off (element 1 is in open circuit since switch 44 is also off). Voltage Vp across element 1 increases under the effect of the vibration to which it is mechanically submitted (the charges are stored in the capacitor of the dielectric and the energy is stored in the piezoelectric material when it is in open circuit). When voltage Vp reaches a level selected as will be seen hereafter, switch 44 is turned on (signal CTRL2 active) to transfer the charges stored in element 1 into the inductance of primary 43 of transformer 4. All the energy stored in piezoelectric element between times t1 and t0 is then transferred into inductance 43. When voltage Vp becomes zero (end of the energy transfer), switch 44 is turned off and switches K1 and K2 are turned back on for a new short-circuit phase. At the turning off of switch 44, the power is transferred to secondary 45 of transformer 4 and into storage capacitor 52.

Control signals CTRL1 and CTRL2 are selected to adjust the resonance frequency of the electromechanical system including piezoelectric element 1 so that it approximately corresponds to the frequency of the vibrations of the mechanical support (resonator) supporting the piezoelectric material and to perform the impedance matching enabling to maximize the recovered power. In other words, signals CTRL1 and CTRL2 are sized to set the resonance frequency of the electromechanical system (mechanical resonator, piezoelectric material, and circuit) and to optimize the energy transfer.

The switching from one phase to the other corresponds to the following operating conditions:
  from short-circuit to open circuit when (time t1) the current in piezoelectric element 1 reaches the level desired for an operation at the resonance;
  from open circuit to resonance (time t2) when the voltage across piezoelectric element 1 reaches a value defined to maximize the power transfer into the storage capacitor; and
  from resonance to short-circuit (time t0) when the voltage across piezoelectric element 1 becomes zero.

Figure 3:
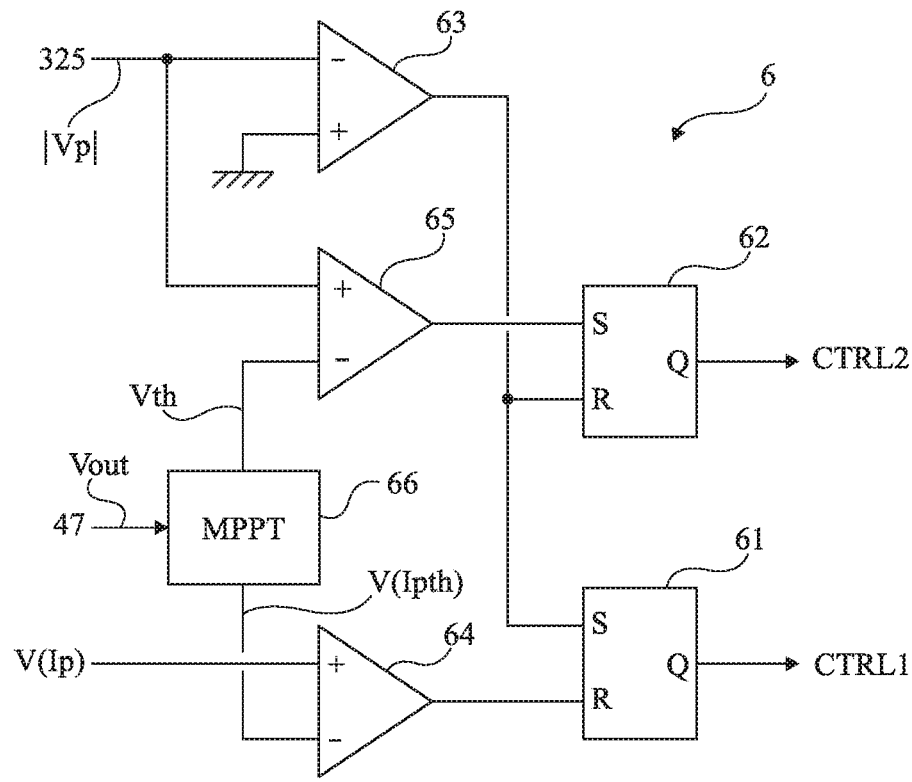
FIG. 3 very schematically shows an embodiment of a circuit for generating signals for controlling the piezoelectric generator of FIG. 1.

FIG. 3 very schematically shows an embodiment of a circuit 6 for generating control signals CTRL1 and CTRL2 of the piezoelectric generator.

The circuit uses three pieces of information:
  the rectified value |Vp| of voltage Vp across piezoelectric element 1;
  information representative (function) of the deformation of piezoelectric element 1, for example, information V(Ip) representative of current Ip in element 1, of its speed, or of its acceleration; and
  information representative (function) of the recovered output power.

Circuit 6 comprises two flip-flops 61 and 62, of RS type, supplying signals CTRL1 and CTRL2, on their respective direct (non-inverted) outputs. The set input S of flip-flop 61 and the reset input R of flip-flop 62 are connected to the output of a comparator 63 detecting the presence of a non-zero voltage across piezoelectric element 1. Comparator 63 receives, on a first input (negative −) the rectified value |Vp| of voltage Vp (this first input is for example connected to terminal 325, FIG. 1). The second input (positive +) of comparator 63 is grounded. Signal CTRL2 is thus forced to zero when voltage Vp is zero (between times t0 and t1, FIGS. 2A to 2D), that is, when element 1 is shorted, and signal CTRL1 is set to one as soon as voltage Vp becomes zero (times t0).

The reset input of flip-flop 61 is connected to the output of a comparator 64 having a first input (positive +) receiving information V(Ip) representative of the value of current Ip in element 1 and having a second input (negative −) receiving a value V(Ipth) representative of a threshold Ipth of current Ip. Function V( ) linking value V(Ip) to current Ip is coherent with (preferably identical to) function V( ) linking values V(Ipth) to threshold Ipth. Thus, signal CTRL1 is forced to zero during periods (between times t1 and t0) when current Ip is lower than threshold Ipth.

The set input S of flip-flop 62 is connected to the output of a comparator 65 having a first input (positive +) receiving the rectified value |Vp| of voltage Vp and having a second input (negative −) receiving a threshold voltage Vth of voltage Vp. Thus, signal CTRL2 is set to one as soon as voltage Vp becomes, in absolute value, higher than threshold Vth.

Thresholds Vth and V(Ipth) are generated (calculated), for example, by a regulator of the maximum power point (MPPT−Maximum Power Point Tracking) to maximize the energy transferred to the load (5, FIG. 1). The information representative of the output power for example corresponds to voltage Vout, an input of regulator 66 being connected to terminal 47 (FIG. 1). Regulator 66 then interprets the variations of voltage Vout between terminals 47 and 48 to deduce therefrom a decrease or an increase of the energy transferred during a period, and thus converge towards the optimal pair of parameters. Any usual maximum power point tracking circuit may be used to generate and control thresholds Vth and V(Ipth) with the values allowing the optimal energy transfer.

The information V(Ip) representative of the current may be obtained by different ways.

Figure 4:
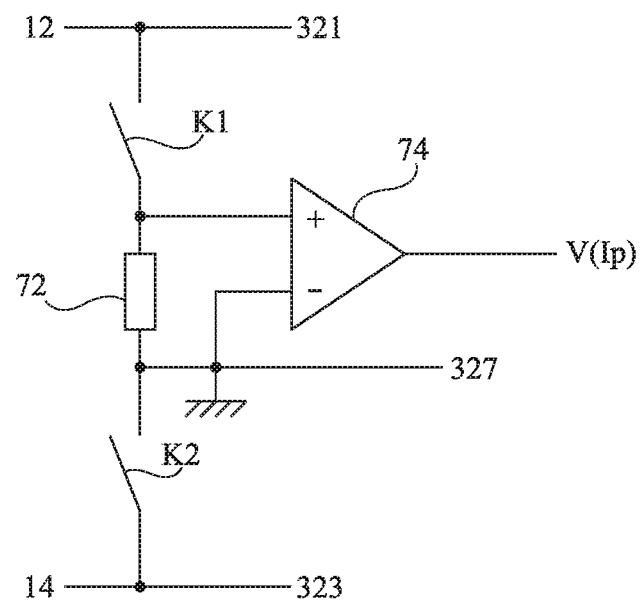
FIG. 4 shows an embodiment of a circuit for providing information representative of the current in the piezoelectric element.

FIG. 4 shows an embodiment of a circuit for supplying information representative of the current in piezoelectric element 1.

A resistor 72 of low value (from a few ohms to a few tens of ohms) is interposed between switch K1 and node 327 of interconnection of switches K1 and K2. The voltage across resistor 72 is measured, for example, with a comparator 74 having its input connected to the respective terminals of resistor 72. The output of comparator 74 supplies a voltage V(Ip) proportional to current Ip.

According to another example, not shown, a switchable current mirror is used to alternately copy (one half-period out of two) the current flowing through switches K1 and K2. According to still another example, not shown, the displacement or the acceleration of the piezoelectric element is measured, for example by placing a sensor on element 1.

An advantage of the described embodiments is that it is now possible to optimize the energy recovery of a piezoelectric element despite variations of the frequency of the vibrations to which it is submitted. In particular, the resonance may now be varied by several tens of Hertz and the entire frequency range between the short-circuit and open circuit resonance frequencies of the piezoelectric element may in particular be covered.

FIGS. 5, 6, 7, and 8 illustrate alternative embodiments of a piezoelectric generator based on the same control principles as those discussed in relation with FIGS. 1 to 4. The circuit for generating signals CTRL1 and CTRL2 has not been shown in FIGS. 5 to 8. Control signals CTRL1 and CTRL2 are identical to those described in relation with the previous drawings.

Figure 5:
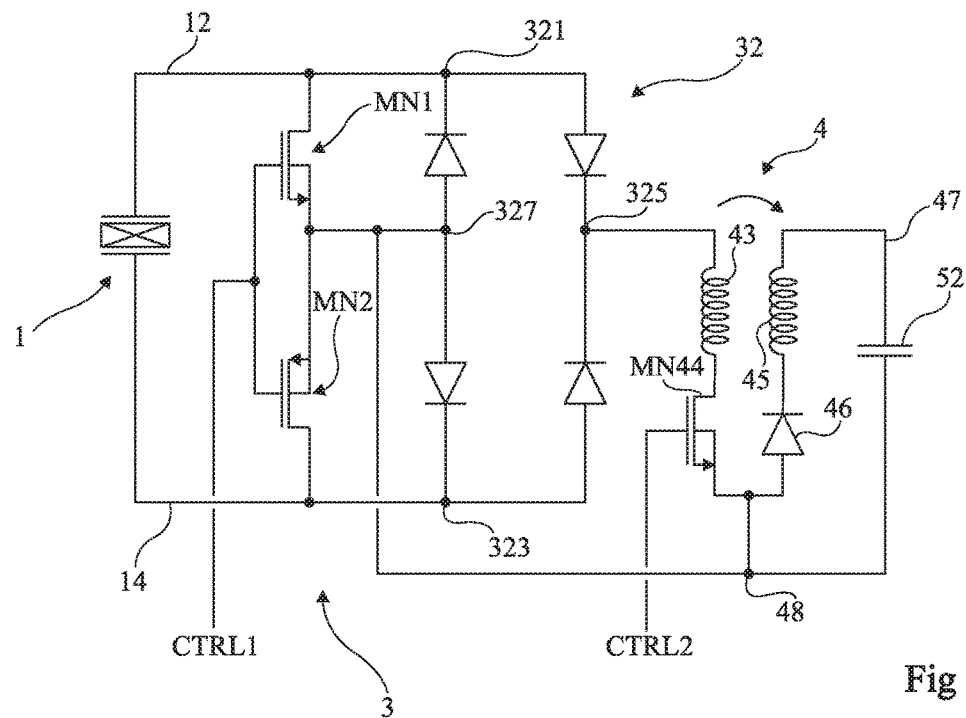
FIGS. 5, 6, 7, and 8 illustrate alternative embodiments of a piezoelectric generator.

As compared with the embodiment of FIG. 1, the embodiment of FIG. 5 details that switches K1, K2, and 44 are MOS transistors MN1, MN2, and MN44 (for example, N-channel MOS transistors). The respective drains of transistors MN1 and MN2 are connected to terminals 12 and 14 of piezoelectric element 1. The sources of transistors MN1 and MN2 are interconnected to terminal 327 and their gates receive signal CTRL1. Transistor MN44 has its source connected to terminal 48 (or 327). Its drain is connected to inductance 43 and its gate receives signal CTRL2. The rest is identical to FIG. 1.

Figure 6:
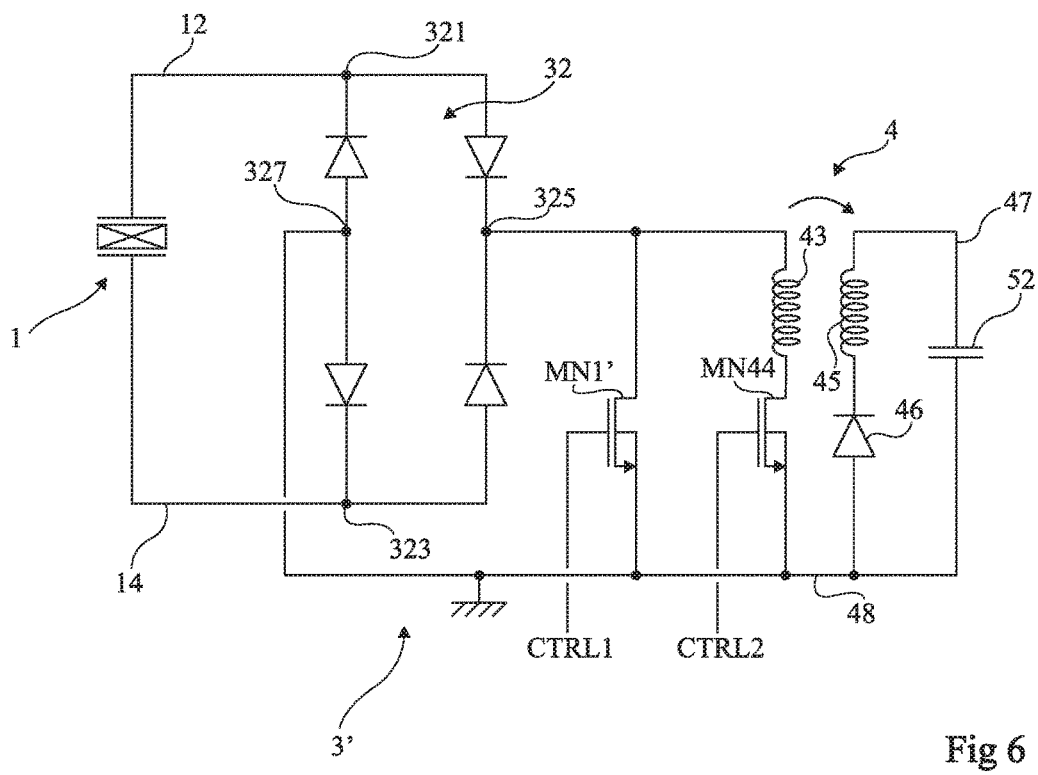

In the embodiment of FIG. 6, the shorting is performed downstream of rectifying bridge 32. Thus, an N-channel MOS transistor MN1' connects outputs 325 and 327 of bridge 32. The gate of transistor MN1' receives signal CTRL1, its source is connected to terminal 327, and its drain is connected to terminal 325. The rest of the circuit of FIG. 5 is identical to that of FIG. 4.

Figure 7:
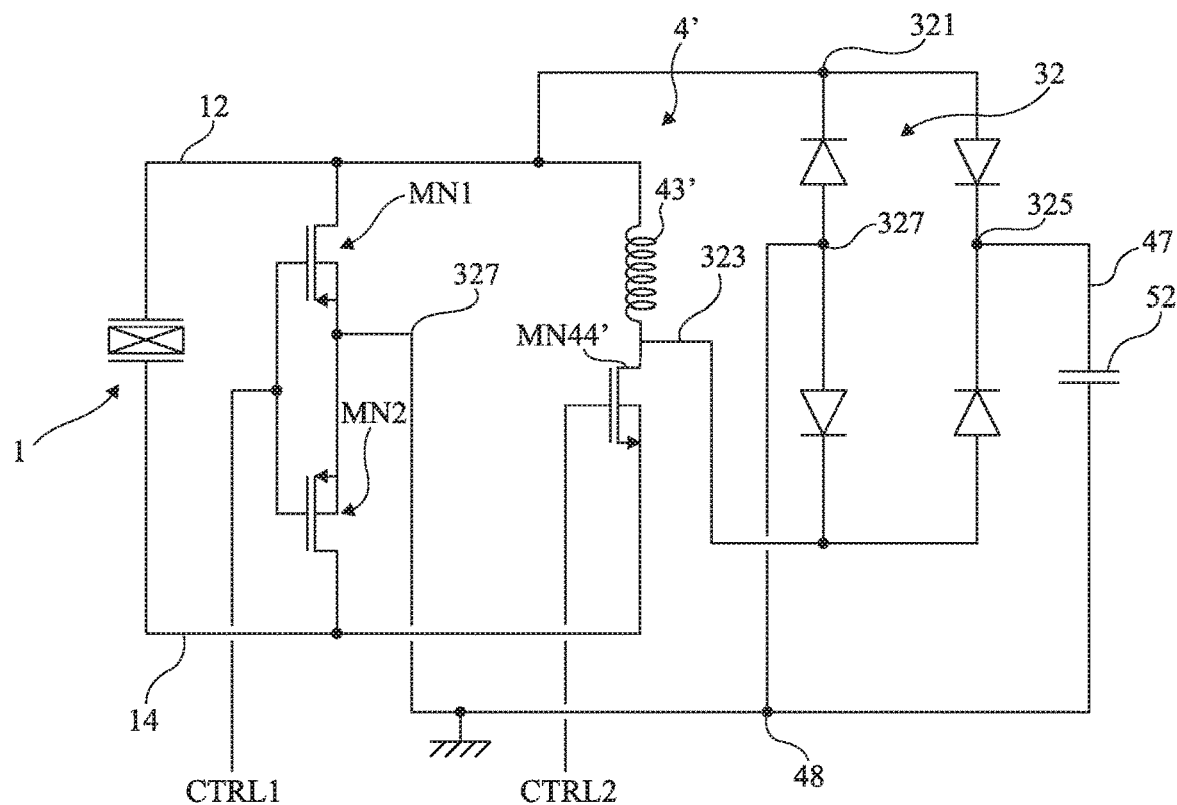

In the embodiment of FIG. 7, inductive converter 4' is formed of a single inductance 43' series-connected with an N-channel MOS transistor MN44' between input terminal 321 of fullwave rectifying bridge 32' and terminal 14 of element 1 (the source being on the side of terminal 14). The junction point of inductance 43' and of switch MN44' is connected to the other input 323 of bridge 32'. Terminals 325 and 327 are respectively connected to output terminals 47 and 48 (across capacitor 52 in this example). Transistors MN1 and MN2 are still series-connected between terminals 12 and 14, their common sources being connected to terminal 327.

Figure 8:
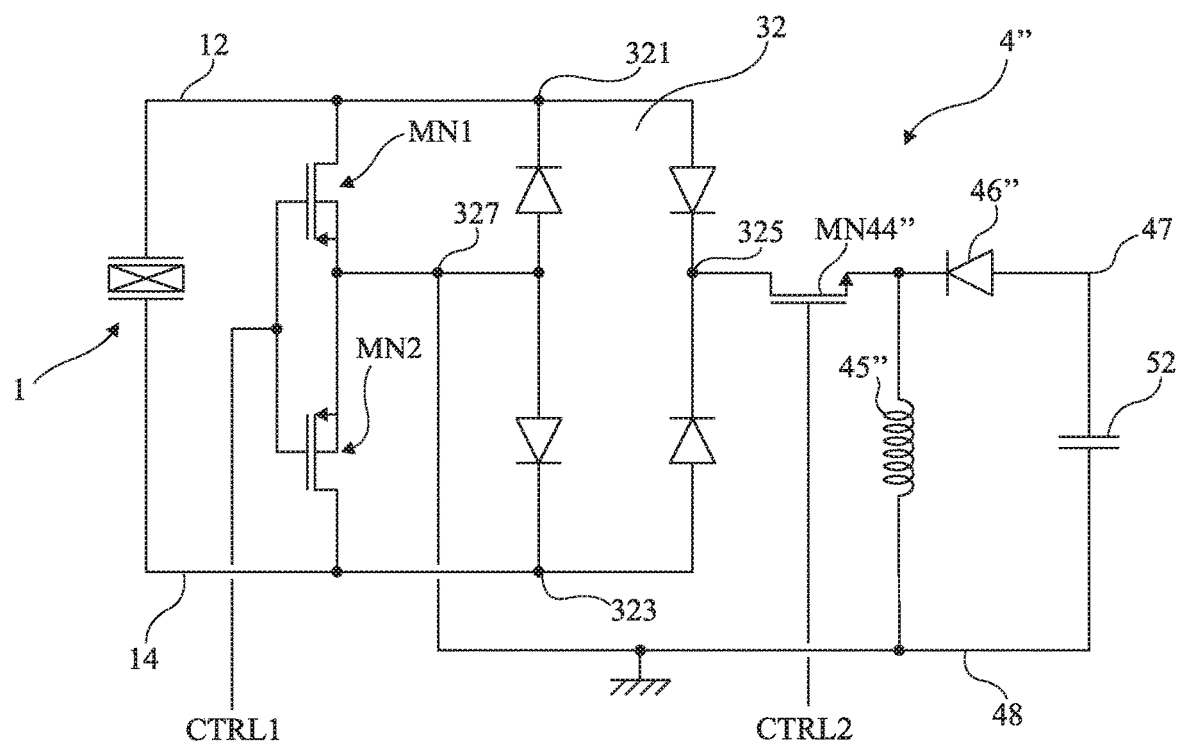

In the embodiment of FIG. 8, as compared with FIG. 4, inductive converter 4" is formed of an N-channel MOS transistor MN44" series-connected with a diode 46" between a first input terminal connected to terminal 325 and a first output terminal 47 connected to an electrode of capacitor 52. The anode of diode 46" is connected to terminal 47 and its cathode is connected to the source of transistor MN44". An inductance 45" connects the junction point of transistor MN44" and of diode 46" to the second input and output terminals of converter 4", and thus to terminals 327 and 48.

The operation of the generators of FIGS. 4 to 7 can be deduced from the operation discussed in relation with the previous drawings.

Various embodiments and variations have been described. Certain embodiments and variations may be combined and other variations and modifications will occur to those skilled in the art. In particular, the selection of the piezoelectric material, the shape of the piezoelectric element, and the sizing of the mechanical resonator depend on the frequency of the vibrations to which the piezoelectric element is submitted. Once the element has been selected, the time intervals between the different cycles depend on the nominal resonance frequency of the piezoelectric material.

Finally, the practical implementation of the embodiments and variations which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A piezoelectric generator comprising:
   a piezoelectric element;
   a switching circuit coupled to the piezoelectric element;
   an inductive converter; and
   a circuit for controlling the switching circuit to, sequentially:
   short the piezoelectric element;
   place the piezoelectric element in open circuit; and
   connect the piezoelectric element to the inductive converter.

2. The generator of claim 1, wherein:
   the switching from the shorting to the placing in open circuit of the piezoelectric element depends on information representative of the deformation of the piezoelectric element; and
   the switching from the open circuit to the connection of the piezoelectric element to the inductive converter depends on the voltage across the piezoelectric element.

3. The generator of claim 2, wherein the conditions of the switching from the shorting to the placing in open circuit of the piezoelectric element and of the switching from the open circuit to the connection of the piezoelectric element to the inductive converter are defined by a regulator of the maximum power point to maximize the energy transferred to a load powered by the inductive converter.

4. The generator of claim 1, comprising at least one switch controlled by the control circuit to perform the shorting or the placing in open circuit.

5. The generator of claim 1, wherein the switching from the state where the piezoelectric element is connected to the inductive converter to the state where the piezoelectric element is shorted is performed when the voltage across the piezoelectric element is zero.

6. The generator of claim 1, wherein said switching circuit is controlled to optimize the energy transfer to a load powered by the inductive converter.

7. The generator of claim 1, wherein said switching circuit includes a voltage rectifier.

8. The generator of claim 1, wherein said switching circuit comprises a rectifying bridge having input terminals coupled across the piezoelectric element and having output terminals coupled to the input of the inductive converter.

9. The generator of claim 8, wherein said circuit comprises two series-connected switches, connected to the terminals of the piezoelectric element, the junction point of the switches being connected to one of the output terminals of the rectifying bridge.

10. The generator of claim 8, wherein the inductive converter comprises a transformer having a first winding series-connected with a third switch between said output terminals of the bridge.

11. The generator of claim 8, wherein said inductive converter comprises an inductive element series-connected with a third switch between the output terminals of the rectifying bridge.

12. The generator of claim 8, wherein said circuit comprises a switch connected between said output terminals of the bridg.

13. The generator of claim 1, wherein said inductive converter comprises an inductive element series-connected with a third switch between input terminals of a rectifying bridge having output terminals connected to output terminals of the generator.

14. The generator of claim 1, wherein the piezoelectric element is coupled or is assembled on a mechanical object capable of making it vibrate.

15. A method of controlling a piezoelectric generator having a piezoelectric element capable of being excited by a mechanical object, comprising successive phases of:
   shorting the piezoelectric element;
   placing the piezoelectric element in open circuit; and
   transferring the charges stored during the open circuit phase to an inductive converter.

16. The method of claim 15, wherein the duration of the open circuit phase is a function, among others, of the damping and of the coupling of the type of piezoelectric generator used, to optimize the power transfer to a load.

* * * * *